(12) United States Patent
Fujii et al.

(10) Patent No.: US 11,130,683 B2
(45) Date of Patent: Sep. 28, 2021

(54) DIELECTRIC COMPOSITION AND ELECTRONIC COMPONENT

(71) Applicant: TDK CORPORATION, Tokyo (JP)

(72) Inventors: Shohei Fujii, Tokyo (JP); Raitarou Masaoka, Tokyo (JP); Maiko Nakamura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/489,636

(22) PCT Filed: Feb. 23, 2018

(86) PCT No.: PCT/JP2018/006705
§ 371 (c)(1),
(2) Date: Aug. 28, 2019

(87) PCT Pub. No.: WO2018/159492
PCT Pub. Date: Sep. 7, 2018

(65) Prior Publication Data
US 2019/0382278 A1 Dec. 19, 2019

(30) Foreign Application Priority Data
Mar. 2, 2017 (JP) .............................. JP2017-039709

(51) Int. Cl.
*C04B 35/48* (2006.01)
*C04B 35/486* (2006.01)
(Continued)

(52) U.S. Cl.
CPC .......... *C01G 25/006* (2013.01); *C23C 14/165* (2013.01); *C23C 14/34* (2013.01);
(Continued)

(58) Field of Classification Search
CPC ..... C04B 35/057; C04B 35/48; C04B 35/486; C04B 2235/3248
See application file for complete search history.

(56) References Cited

U.S. PATENT DOCUMENTS

| 5,916,834 A | 6/1999 | Terashi et al. |
| 9,643,890 B2 * | 5/2017 | Masaoka ................. H01B 3/12 |

(Continued)

FOREIGN PATENT DOCUMENTS

| JP | 2000103673 A * | 4/2000 |
| JP | 2000239062 A * | 9/2000 |

(Continued)

OTHER PUBLICATIONS

Yu et al., Preparation and characterization of sol-gel derived CaZrO3 dielectric thin films for high-k applications; Physica B; 2004; pp. 440-445; vol. 348.

(Continued)

*Primary Examiner* — Karl E Group
(74) *Attorney, Agent, or Firm* — Oliff PLC

(57) ABSTRACT

A dielectric composition having a high relative dielectric constant and high Q value even at high frequencies, and an electronic component including a dielectric film configured from the dielectric composition. This dielectric composition includes the composite oxide represented by general formula $(aCaO+bSrO)$—$ZrO_2$ as a main component, and by a and b satisfying the relationships $a \geq 0$, $b \geq 0$, and $1.50 < a+b \leq 4.00$.

6 Claims, 2 Drawing Sheets

(51) Int. Cl.
  *H01G 4/12* (2006.01)
  *C01G 25/00* (2006.01)
  *C23C 14/16* (2006.01)
  *C23C 14/34* (2006.01)
  *H01G 4/30* (2006.01)

(52) U.S. Cl.
  CPC .......... *H01G 4/1236* (2013.01); *H01G 4/306* (2013.01); *C01P 2006/40* (2013.01)

(56) References Cited

U.S. PATENT DOCUMENTS

2009/0046410 A1* 2/2009 Takeoka .............. C04B 35/49 361/321.4
2015/0274600 A1* 10/2015 Masaoka .............. C04B 35/486 501/135

FOREIGN PATENT DOCUMENTS

| JP | 2004-207629 A | | 7/2004 |
| JP | 2007-019504 A | | 1/2007 |
| JP | 2007254210 A | * | 10/2007 |
| JP | 2009-007209 A | | 1/2009 |
| JP | 2015-195342 A | | 11/2015 |

OTHER PUBLICATIONS

Lu et al., "Dielectric properties of SrZrO3 thin films prepared by pulsed laser deposition;" Appl. Phys. A; 2003; pp. 481-484; vol. 77.
May 15, 2018 Search Report issued in International Patent Application No. PCT/JP2018/006705.
Sep. 3, 2019 International Preliminary Report on Patentability issued in International Patent Application No. PCT/JP2018/006705.
Noguchi, Tetsuo, et al; "Fundamental Research in Refractory System with a Solar Furnace-ZrO2—CaO System"; Solar Energy; vol. 11; Nos. 3 and 4; pp. 145-152 (Jul. 1, 1967).

* cited by examiner

DIELECTRIC COMPOSITION AND ELECTRONIC COMPONENT

BACKGROUND OF THE INVENTION

The present invention relates to a dielectric composition and an electronic component having a dielectric film including the dielectric composition.

Mobile communication devices such as smart phones and the like are demanded to attain high performance, and for example in order to achieve a high speed and a high capacity communication, a number of frequency bands being used is increasing. The frequency bands being used is high frequency bands such as GHz. Some of high frequency components such as a filter or a combination of filters for example a duplexer, a diplexer, and the like which are used at high frequency bandwidth mentioned in above uses dielectric properties of the dielectric material. For such dielectric material, it is demanded to have a low dielectric loss and to pass a specific frequency selectively.

Also, as the mobile communication devices attained a higher performance, a number of electronic components mounted to one mobile communication device are increasing. Therefore, in order to maintain the size of the mobile communication device, it is also demanded to make the electronic component more compact. In order to make the high frequency component using the dielectric material more compact, it is necessary to reduce an area of electrode, thus a high relative permittivity of the dielectric material is demanded in order to compensate a capacitance decrease.

Therefore, the dielectric material applied to the high frequency electronic component at high frequency bands is demanded to have a low dielectric loss and a high relative permittivity at high frequency bands. A Q value is a reciprocal of the dielectric loss, in other words, the dielectric material having a high relative permittivity and a high Q value at high frequency band is demanded.

As a conventional dielectric material having a low dielectric loss at GHz bands, for example an amorphous $SiN_x$ film may be mentioned. However, a relative permittivity (εr) of the amorphous $SiN_x$ film is 6.5 or so which is low and it was difficult to make the high frequency component more compact.

However, Non-Patent Document 1 discloses that a $CaZrO_3$ amorphous thin film can be obtained by performing an annealing treatment to the $CaZrO_3$ thin film at a predetermined temperature. According to Non-Patent Document 1, this $CaZrO_3$ amorphous thin film has a relative permittivity of 12.8 to 16.0 at a measuring frequency of 100 kHz and a dielectric loss of 0.0018 to 0.0027 at a measuring frequency of 100 kHz.

Also, Non-Patent Document 2 discloses a $SrZrO_3$ thin film and this $SrZrO_3$ thin film has a relative permittivity of 24 to 27 within a measuring frequency of 2.6 to 11.2 MHz and a dielectric loss of 0.01 to 0.02 within a measuring frequency of 2.6 to 11.2 MHz.

Non-Patent Document 1: T. Yu, et al, "Preparation and characterization of sol-gel derived CaZrO3 dielectric thin films for high-k applications", Physica B, 348 (2004) 440-445

Non-Patent Document 2: X. B. Lu, et al, "Dielectric properties of SrZrO3 thin films prepared by pulsed laser deposition", Applied Physics A, 77, 481-484(2003)

BRIEF SUMMARY OF THE INVENTION

However, when the dielectric loss of the $CaZrO_3$ amorphous thin film described in Non-Patent Document 1 is converted to a Q value, it is 370 to 555 at a measuring frequency of 100 kHz. Also, according to FIG. 7 of Non-Patent Document 1, when the measuring frequency is 1 MHz, the dielectric loss is 0.005 or more, that is a Q value is 200 or less. Therefore, in case the measuring frequency is within GHz bands, a Q value is expected to decrease even more.

Also, when the dielectric loss of the $SrZrO_3$ thin film shown in Non-Patent Document 2 is converted to a Q value, it is 100 or less within the range of a measuring frequency of 2.6 to 11.2 MHz. Therefore, when the measuring frequency is within GHz bands, a Q value is expected to decrease even more as similar to the case of Non-Patent Document 1.

The present invention is attained in view of such circumstances, and the object is to provide the dielectric composition having a high relative permittivity and a high Q value even at high frequency bands and also to provide an electronic component having a dielectric film constituted from the dielectric composition.

In order to attain the above object, the dielectric composition of the present invention is

[1] A dielectric composition including a complex oxide expressed by a general formula $(aCaO+bSrO)-ZrO_2$ as a main component, in which "a" and "b" of the general formula satisfy a≥0, b≥0, and 1.50<a+b≤4.00.

[2] The dielectric composition according to [1], wherein "a" and "b" of the general formula satisfy 1.50<a+b≤2.20.

[3] The dielectric composition according to [1], wherein "a" and "b" of the general formula satisfy 3.00≤a+b≤4.00.

[4] An electronic component comprising a dielectric film including the dielectric composition according to any one of [1] to [3].

According to the present invention, the dielectric composition having a high relative permittivity and a high Q value even at high frequency bands can be provided and also the electronic component having a dielectric film constituted from the dielectric composition can be provided.

DETAILED DESCRIPTION OF THE INVENTION

Hereinafter, the present invention is described in detail in below listed order based on a specific embodiment.
1. Thin Film Capacitor
   1.1 Overall Constitution of Thin Film Capacitor
   1.2 Dielectric Film
   1.2.1 Dielectric Composition
   1.3 Substrate
   1.4 Lower Electrode
   1.5 Upper Electrode
2. Method in Producing Thin Film Capacitor
3. Effects of the Present Embodiment
4. Modified Example

1. Thin Film Capacitor

First, as an electronic component according to the present embodiment, a thin film capacitor in which a dielectric layer is constituted from a thin dielectric film is explained.

(1.1 Constitution of Thin Film Capacitor as a Whole)

Figure 1:
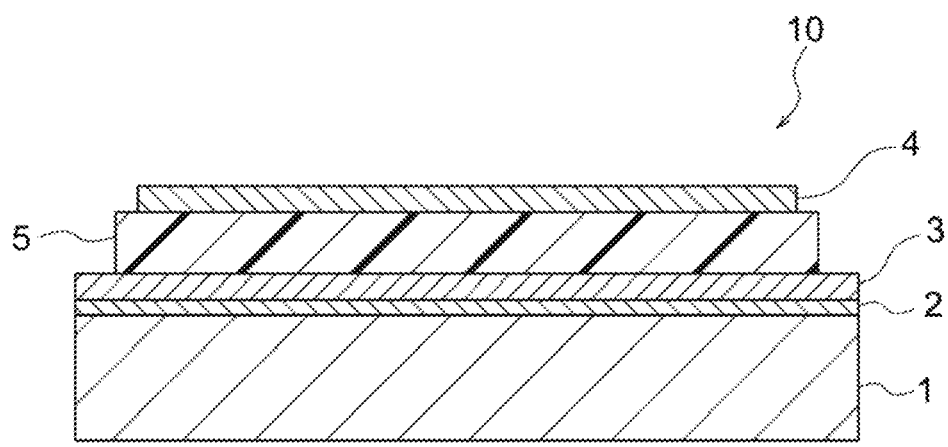
FIG. 1 is a cross section of a thin film capacitor as an electronic component according to one embodiment of the present invention.

As shown in FIG. 1, a thin film capacitor 10 as an example of the electronic component according to the present embodiment has a constitution in which a substrate 1, a lower electrode 3, a dielectric film 5, and an upper electrode 4 are stacked in this order. The lower electrode 3, the dielectric film 5, and the upper electrode 4 form a capacitor part and when the lower electrode 3 and the upper electrode 4 are connected to an external circuit and voltage is applied, the dielectric film 5 exhibits a predetermined capacitance, thereby the capacitor part function as a capacitor. Each constitution element will be discussed in detail in below.

Also, in the present embodiment, an underlayer 2 is formed between the substrate 1 and the lower electrode 3 in order to improve adhesiveness between the substrate 1 and the lower electrode 3. A material constituting the underlayer 2 is not particularly limited as long as the adhesiveness between the substrate 1 and the lower electrode 3 can be sufficiently secured. For example, when the lower electrode 3 is constituted from Cu, the underlayer 2 can be constituted from Cr; and when the lower electrode 3 is constituted from Pt, the underlayer 2 can be constituted from Ti.

Also, in the thin film capacitor 10 shown in FIG. 1, a protective film may be formed for blocking the dielectric film 5 from external atmosphere.

Note that, a shape of a thin film capacitor is not particularly limited, and usually it is rectangular parallelepiped shape. Also, a size of the thin film capacitor is not particularly limited, and a thickness and a length may be determined appropriately depending on the purpose of use.

(1.2 Dielectric Film)

The dielectric film 5 is constituted from the dielectric composition according to the present embodiment described in below. Also, in the present embodiment, the dielectric film 5 is not constituted from a sintered body obtained by sintering a molded article of a raw material powder of the dielectric composition but preferably the dielectric film 5 is a dielectric deposition film of a thin film made by a known film forming method. Note that, the dielectric film 5 may be crystalline or amorphous; and in the present embodiment the dielectric film 5 is preferably crystalline.

The thin film capacitor having such dielectric film 5 exhibits a high Q value (for example 500 or more) and a high relative permittivity (for example 13.0 or more) even at high frequency bands (for example 2 GHz).

The thickness of the dielectric layer 5 is preferably 10 nm to 2000 nm, and more preferably 50 nm to 1000 nm. When the dielectric film 5 is too thin, an insulation breakdown of the dielectric film 5 tends to easily occur. If the insulation breakdown occurs, a capacitor cannot exhibit its function. On the other hand, when the dielectric film 5 is too thick, a larger electrode area is needed to attain larger capacitance of the capacitor, thus in some case it becomes difficult to make the electronic component more compact depending on the design of the electronic component.

Usually, Q value tends to decrease when a dielectric becomes thinner, and it is necessary to constitute a dielectric to have certain degree of thickness in order to attain a high Q value. However, the dielectric film constituted from the dielectric composition according to the present embodiment can attain a high Q value even when the dielectric film is extremely thin.

Note that, the thin film capacitor including the dielectric film 5 is processed using FIB (Focused Ion Beam) processing device and the obtained cross section is observed using SIM (Scanning Ion Microscope) and the like, thereby the thickness of the dielectric film 5 can be measured.

(1.2.1 Dielectric Composition)

The dielectric composition according to the present embodiment includes an oxide expressed by a general formula $(aCaO+bSrO)-ZrO_2$ as a main component. That is, a complex oxide includes Ca and/or Sr and also includes Zr. In the above general formula, "a" represents a content of CaO in terms of molar ratio with respect to a content of $ZrO_2$, and "b" represents a content of SrO in terms of molar ratio with respect to a content of $ZrO_2$. In the present embodiment, "a" and "b" satisfy $a \geq 0$, $b \geq 0$, and $1.50 < a+b \leq 4.00$; and preferably "a" and "b" satisfy $1.55 \leq a+b \leq 4.00$.

Also, as it is apparent from the above mentioned general formula, the above complex oxide is a complex oxide formed of oxide of divalent element and $ZrO_2$. In the present embodiment, CaO and SrO are selected from alkaline earth metal oxides as the oxide of divalent element; and a total content of these are more than 1.50 times and 4.00 times or less in terms of molar ratio with respect to the content of $ZrO_2$. By having "a" and "b" within the above range, excellent dielectric properties (high Q value and high relative permittivity at high frequency bands) can be attained.

When "a+b" is too small, for example when of a+b=1.00, it tends to be difficult to attain a high Q value at high frequency bands. When "a+b" is too large, it tends to be difficult to attain a high relative permittivity at high frequency bands.

Note that, when of a+b=1.00, the complex oxide is shown as $(Ca, Sr)ZrO_3$. When a=1.00, the complex oxide is represented as $CaZrO_3$; and when b=1.00, then the complex oxide is represented as $SrZrO_3$. Therefore, from the point of $(Ca, Sr)ZrO_3$, the above complex oxide has a constitution which includes an excessive amount of oxide of divalent element (divalent element oxide rich composition) with respect to the content of $ZrO_2$.

Conventionally, the above mentioned CaO and/or SrO rich composition was rarely considered for use because the excess amount of CaO and/or SrO easily reacts with water.

Also, as long as $1.50 < a+b \leq 4.00$ is satisfied, either "a" or "b" may be zero. Therefore, the above mentioned complex oxide may be $aCaO-ZrO_2$ or $bSrO-ZrO_2$. From the point of the dielectric properties, $bSrO-ZrO_2$ is preferable than $aCaO-ZrO_2$; and from the point of stability against water, $aCaO-ZrO_2$ is preferable than $bSrO-ZrO_2$.

In the present embodiment, "a+b" preferably satisfies $1.50 < a+b \leq 2.20$ and more preferably satisfies $1.55 \leq a+b \leq 2.20$. By having "a+b" within the above range, even higher relative permittivity (for example 18.0 or more) can be attained while attaining a high Q value (for example 500 or more) at high frequency bands (for example 2 GHz).

Also, preferably "a+b" satisfies $3.00 \leq a+b \leq 4.00$. By having "a+b" within the above range, even higher Q value (for example 570 or more) can be attained while attaining a high relative permittivity (for example 13.0 or more) at high frequency bands (for example 2 GHz).

Also, preferably "a+b" satisfies $2.20 < a+b < 3.00$. By having "a+b" within the above range, a high relative permittivity (for example 15.0 or more) and a high Q value (for example 550 or more) can be both attained at high frequency bands (for example 2 GHz).

Also, the dielectric composition according to the present embodiment may include a trace amount of impurities, subcomponents, and the like as long as the present invention can exhibit its effect. In the present embodiment, the main component is 70 mol % or more and 100 mol % or less with respect to the entire dielectric composition.

(1.3 Substrate)

The substrate shown in FIG. 1 is not particularly limited as long as it is constituted from a material having mechanical strength which can support the underlayer 2, the lower electrode 3, the dielectric film 5, and the upper electrode 4 which are formed on the substrate 1. For example, a single crystal substrate constituted from Si single crystal, SiGe single crystal, GaAs single crystal, InP single crystal, $SrTiO_3$ single crystal, MgO single crystal, $LaAlO_3$ single crystal, $ZrO_2$ single crystal, $MgAl_2O_4$ single crystal, $NdGaO_3$ single crystal, and the like; a ceramic polycrystal substrate constituted from $Al_2O_3$ polycrystal, ZnO polycrystal, $SiO_2$ polycrystal, and the like; a metal substrate constituted from metals such as Ni, Cu, Ti, W, Mo, Al, Pt, an alloy of these; and like may be mentioned. In the present embodiment, from the point of low cost and processability, Si single crystal is used as the substrate.

A thickness of the substrate 1 is for example between 10 μm to 5000 μm. When it is too thin, a mechanical strength may not be enough in some case, and when it is too thick, in some case the electronic component cannot be made compact.

The above mentioned substrate 1 has a different resistivity depending on the material of the substrate. When the substrate is constituted by the material having a low resistivity, current may leak towards the substrate side while the thin film capacitor is running, and this may affect the electric properties of the thin film capacitor. Thus, when the resistivity of the substrate 1 is low, preferably an insulation treatment is performed to the surface of the substrate 1 so that current does not leak towards the substrate 1 side while the capacitor is running.

For example, when Si single crystal is used as the substrate 1, an insulation layer is preferably formed on the surface of the substrate 1. As long as the substrate 1 and the capacitor part are sufficiently insulated, the material constituting the insulation layer and the thickness of the insulation layer are not particularly limited. In the present embodiment, as the material constituting the insulation layer, $SiO_2$, $Al_2O_3$, $Si_3N_x$, and the like may be mentioned as examples. Also, the thickness of the insulation layer is preferably 0.01 μm or more.

(1.4 Lower Electrode)

As shown in FIG. 1, the lower electrode 3 is formed in a thin film form on the substrate 1 via the underlayer 2. The dielectric film 5 is placed between the lower electrode 3 and the upper electrode 4 which is described in below and the lower electrode 3 is an electrode which allows the dielectric film 5 to function as a capacitor. The material constituting the lower electrode 3 is not particularly limited as long as it has conductivity. For example, metals such as Pt, Ru, Rh, Pd, Ir, Au, Ag, Cu, Ni, and the like; the alloy thereof; or a conductive oxide; and the like may be mentioned.

A thickness of the lower electrode 3 is not particularly limited as long as the lower electrode 3 functions as an electrode. In the present embodiment, the thickness is preferably 0.01 μm or more.

(1.5 Upper Electrode)

As shown in FIG. 1, the upper electrode 4 is formed in a thin film form on the surface of the dielectric film 5. The dielectric film 5 is placed between the upper electrode 4 and the lower electrode 3 and the upper electrode 4 is an electrode which allows the dielectric film 5 to function as a capacitor. Therefore, the upper electrode 4 and the lower electrode 3 have a different polarity.

As similar to the lower electrode 3, a material constituting the upper electrode 4 is not particularly limited as long as it has conductivity. For example, metals such as Pt, Ru, Rh, Pd, Ir, Au, Ag, Cu, Ni, and the like; the alloy thereof; or a conductive oxide; and the like may be mentioned.

2. Method for Producing Thin Film Capacitor

Next, an example of the method for producing the thin film capacitor 10 shown in FIG. 1 is described in below.

First, the substrate 1 is prepared. As the substrate 1, for example when using a Si single crystal substrate, an insulation layer is formed on one of a main face of the substrate. As a method for forming the insulation layer, a known method for forming a film such as a thermal oxidation method, a CVD (Chemical Vapor Deposition) method, and the like may be used.

Next, a thin film made of a material constituting an underlayer is formed on the insulation layer which has been formed using a known method for forming a film thereby the underlayer 2 is formed.

After the underlayer 2 is formed, a thin film made of a material constituting a lower electrode is formed on the underlayer 2 using a known method for forming a film thereby the lower electrode 3 is formed.

After the lower electrode 3 is formed, a heat treatment may be carried out in order to improve adhesiveness between the underlayer 2 and the lower electrode 3 and also to improve a stability of the lower electrode 3. As a heat treatment condition, for example a temperature rising rate is preferably 10° C./min to 2000° C./min and more preferably 100° C./min to 1000° C./min. A holding temperature during the heat treatment is preferably 400° C. to 800° C. and a holding time is preferably 0.1 hour to 4.0 hours. When the heat treatment condition is out of the above mentioned range, the underlayer 2 and the lower electrode 3 may not adhere sufficiently and also the surface of the lower electrode 3 easily becomes rough. As a result, the dielectric properties of the dielectric film 5 tend to easily decrease.

Next, the dielectric film 5 is formed on the lower electrode 3. In the present embodiment, the dielectric film 5 is formed as a deposition film of which the material constituting the dielectric film 5 is deposited in a film form on the lower electrode 3 by a known method for forming a film.

As a known method for forming a film, for example a vacuum deposition method, a sputtering method, a PLD method (Pulsed Laser Deposition method), a MO-CVD method (Metal Organic Chemical Vapor Deposition method), a MOD method (Metal Organic Decomposition method), a sol-gel method, a CSD method (Chemical Solution Deposition method), and the like may be mentioned. Note that, a trace amount of impurities, subcomponents, and the like may be included in a used raw material (a deposition material, various target materials, an organometallic material, and the like) when the film is formed but as long as the desired dielectric properties can be attained this may not be an issue.

Next, a thin film of material constituting the upper electrode is formed by a known method for forming a film on the dielectric film 5 which has been formed; thereby the upper electrode 4 is formed.

By going through the above mentioned steps, the thin film capacitor 10 having a capacitor part (the lower electrode 3, the dielectric film 5, and the upper electrode 4) on the substrate 1 as shown in FIG. 1 can be obtained. Note that, a protective film for protecting the dielectric film 5 may be formed so as to cover at least part of the dielectric film 5 which is exposed to outside using a known method for forming a film.

3. Effect in the Present Embodiment

The present embodiment focuses on the complex oxide of $ZrO_2$ and the oxide of divalent element as the dielectric composition having good dielectric properties at high frequency bands. Further, as the divalent element, Ca and Sr are only selected, and also a total molar amount of these oxides with respect to $ZrO_2$ is controlled to be in the specific range larger than 1. That is, an excess amount of CaO and/or SrO are included with respect to $ZrO_2$.

By doing so, when the dielectric composition according to the present embodiment is deposited as a thin deposition film, a high relative permittivity (for example 13.0 or more) and a high Q value (for example 500 or more) can be attained at high frequency bands (for example 2 GHz). That is, when a Q value is converted to a dielectric loss, it is 0.002 or less which means that extremely low dielectric loss is attained even at frequency of GHz bands.

Also, by changing the range of "a+b", a dielectric composition focused on obtaining a high relative permittivity, a dielectric composition focused on obtaining a high Q value, and a dielectric composition focused on balancing a relative permittivity and a Q value can be obtained depending on the purpose of use.

The dielectric composition according to the present embodiment can attain both a high relative permittivity and a high Q value at high frequency bands, thus the electronic component using the dielectric composition according to the present embodiment can be compact compared to a conventional electronic component, and also the electronic component of the present embodiment can selectively pass a specific frequency compared to a conventional electronic component at high frequency bands.

4. Modified Examples

The above embodiment was described based on the case in which the dielectric film is constituted only by the dielectric composition of the present invention but the dielectric film may be a multilayer structure combined with a film of other dielectric composition. For example, by forming a multilayer structure with an amorphous dielectric film or crystal film of known $Si_3N_x$, $SiO_x$, $Al_2O_x$, $ZrO_x$, $Ta_2O_x$, and the like, changes in impedance and relative permittivity of the dielectric film 5 caused by a temperature change can be regulated.

In the above embodiment, the underlayer is formed to improve the adhesiveness between the substrate and the lower electrode, however when the adhesiveness between the substrate and the lower electrode can be secured sufficiently, and then the underlayer may be omitted. Also, when metals such as Cu, Ni, Pt, and the like; an alloy thereof; a conductive oxide; and the like which can be used as an electrode is used as the material constituting the substrate, then the underlayer and the lower electrode can be omitted.

Hereinabove, the embodiment of the present invention has been described, but the present invention is not to be limited thereto and various modifications may be performed within the scope of the present invention.

EXAMPLES

Hereinafter, the present invention is described in further detail using examples and comparative examples. Note that, the present invention is not to be limited below examples.

Example 1 and Comparative Example 1

First, a target necessary for forming a dielectric film was produced as described in below.

As raw material powders for producing a target, powders of $CaCO_3$, $SrCO_3$, and $ZrO_2$ were prepared. These powders were weighed so as to satisfy compositions of Sample No. 1 to Sample No. 24 shown in Table 1. The weighed raw material powders, absolute ethanol, and $ZrO_2$ beads having ϕ2 mm were put in a wide mouth polypropylene pot having a capacity of 1 L and wet mixing was carried out for 20 hours. Then, a mixed powder slurry was dried for 20 hours at 100° C., and the obtained mixed powder was put in $Al_2O_3$ crucible, then it was calcined for 5 hours at 1250° C. in air atmosphere; thereby a calcined powder was obtained.

The obtained calcined powder was molded using a uniaxial pressing machine thereby a molded article was obtained. The molding condition was pressure of $2.0 \times 10^8$ Pa at room temperature.

Then, the obtained molded article was fired in a temperature rising rate of 200° C./hour at a holding temperature of 1600° C. to 1700° C. for a holding time of 12 hours in air atmosphere; thereby a sintered body was obtained.

Both surfaces of the obtained sintered body were polished using a cylindrical grinder so that the thickness of the obtained sintered body was 4 mm, thereby the target for forming the dielectric film was obtained.

Next, a square substrate of 10 mm×10 mm having a $SiO_2$ insulation layer with a thickness of 6 μm on a surface of the Si single crystal substrate with a thickness of 350 μm was prepared. To the surface of this substrate, a Ti thin film having a thickness of 20 nm as an underlayer was formed by a sputtering method.

Next, on the Ti thin film formed in above, a Pt thin film as the lower electrode having a thickness of 100 nm was formed by a sputtering method.

To the formed Ti/Pt thin film (the underlayer and the lower electrode), a heat treatment was performed in a temperature rising rate of 400° C./min at a holding temperature of 700° C. for a temperature holding time of 0.5 hour under oxygen atmosphere.

A dielectric film was formed on the Ti/Pt thin film after the heat treatment. In the present examples, the dielectric film was formed by a PLD method so that the thickness was 400 nm on the lower electrode using the target formed in above. A condition for forming the film by a PLD method was oxygen pressure of $1.0 \times 10^{-1}$ Pa and the substrate was heated to 200° C. Also, in order to expose part of the lower electrode, a metal mask was used to form an area where the dielectric film was not formed.

Next, an Ag thin film as an upper electrode was formed on the obtained dielectric film using a deposition machine. The upper electrode is formed so as to have a shape having a diameter of 100 μm and a thickness of 100 nm using the metal mask. Thereby, the thin capacitors of Sample No. 1 to Sample No. 24 having the constitution shown in FIG. 1 were obtained.

Note that, a composition of the dielectric film was analyzed using XRF (X-ray fluorescence element analysis) for all of the samples to confirm that the composition matched the composition shown in Table 1. Also, the thin film capacitor was processed using FIB and the obtained cross section was observed using SIM to measure the length, thereby the thickness of the dielectric film was obtained.

For all of the obtained thin film capacitor samples, a relative permittivity and a Q value were measured by below described method.

<Relative Permittivity and Q Value>

A relative permittivity and a Q value were calculated (no unit) from the thickness of the above obtained dielectric film and a capacitance which was measured using an RF impedance/material analyzer (4991A made by Agilent) at a standard temperature of 25° C. by inputting a frequency of 2 GHz, an input signal level (measuring voltage) of 0.5 Vrms. In the present examples, a relative permittivity of 13.0 or more was considered good which is about 2 times of the relative permittivity of amorphous $SiN_x$ film. Also, a Q value of 500 or more was considered good since a Q value of an amorphous $SiN_x$ film was about 500. Results are shown in Table 1, FIG. 2A, and FIG. 2B.

TABLE 1

| | | (aCaO + bSrO) – $ZrO_2$ | | | | Properties | |
|---|---|---|---|---|---|---|---|
| | | | | | | Q | Relative permittivity |
| Sample No. | | a | b | a + b | Thickness (nm) | at 2 GHz (—) | at 2 GHz (—) |
| Example 1 | 1 | 1.51 | 0.00 | 1.51 | 400 | 502 | 19.8 |
| | 2 | 0.76 | 0.75 | | 400 | 505 | 20.2 |
| | 3 | 0.00 | 1.51 | | 400 | 510 | 20.6 |
| | 4 | 1.55 | 0.00 | 1.55 | 400 | 515 | 19.6 |
| | 5 | 0.78 | 0.77 | | 400 | 519 | 20.0 |
| | 6 | 0.00 | 1.55 | | 400 | 525 | 20.3 |
| | 7 | 2.20 | 0.00 | 2.20 | 400 | 553 | 18.3 |
| | 8 | 1.10 | 1.10 | | 400 | 559 | 18.6 |
| | 9 | 0.00 | 2.20 | | 400 | 562 | 19.1 |
| | 10 | 2.60 | 0.00 | 2.60 | 400 | 559 | 16.8 |
| | 11 | 1.30 | 1.30 | | 400 | 562 | 17.2 |
| | 12 | 0.00 | 2.60 | | 400 | 567 | 17.5 |
| | 13 | 3.00 | 0.00 | 3.00 | 400 | 592 | 15.8 |
| | 14 | 1.50 | 1.50 | | 400 | 587 | 16.3 |
| | 15 | 0.00 | 3.00 | | 400 | 571 | 16.9 |
| | 16 | 4.00 | 0.00 | 4.00 | 400 | 662 | 13.5 |
| | 17 | 2.00 | 2.00 | | 400 | 659 | 13.7 |
| | 18 | 0.00 | 4.00 | | 400 | 678 | 14.3 |
| Comparative example 1 | 19 | 1.30 | 0.00 | 1.30 | 400 | 489 | 21.2 |
| | 20 | 0.65 | 0.65 | | 400 | 468 | 21.5 |
| | 21 | 0.00 | 1.30 | | 400 | 483 | 21.8 |
| | 22 | 4.50 | 0.00 | 4.50 | 400 | 709 | 12.1 |
| | 23 | 2.25 | 2.25 | | 400 | 699 | 12.5 |
| | 24 | 0.00 | 4.50 | | 400 | 693 | 12.9 |

Figure 2A:
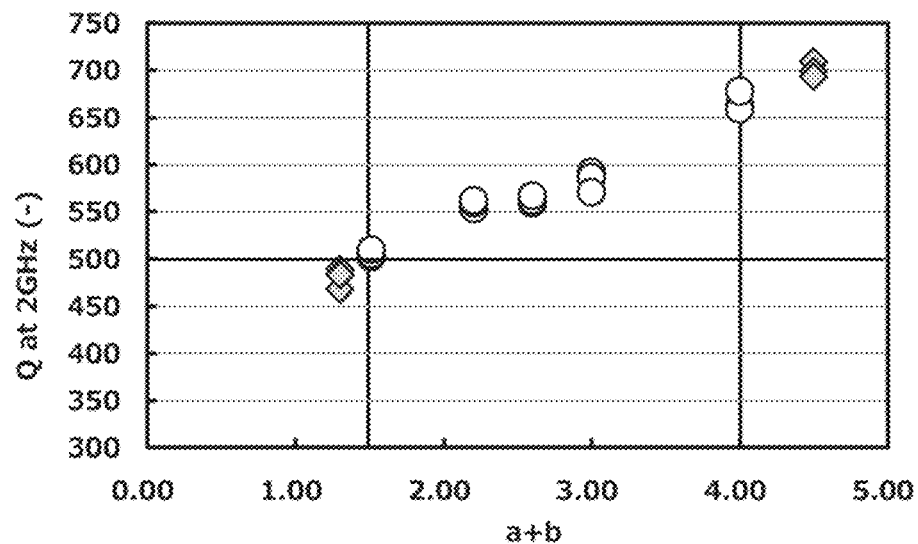
FIG. 2A is a graph showing a relation between "a+b" and Q value at 2 GHz of examples and comparative examples of the present invention.
Figure 2B:
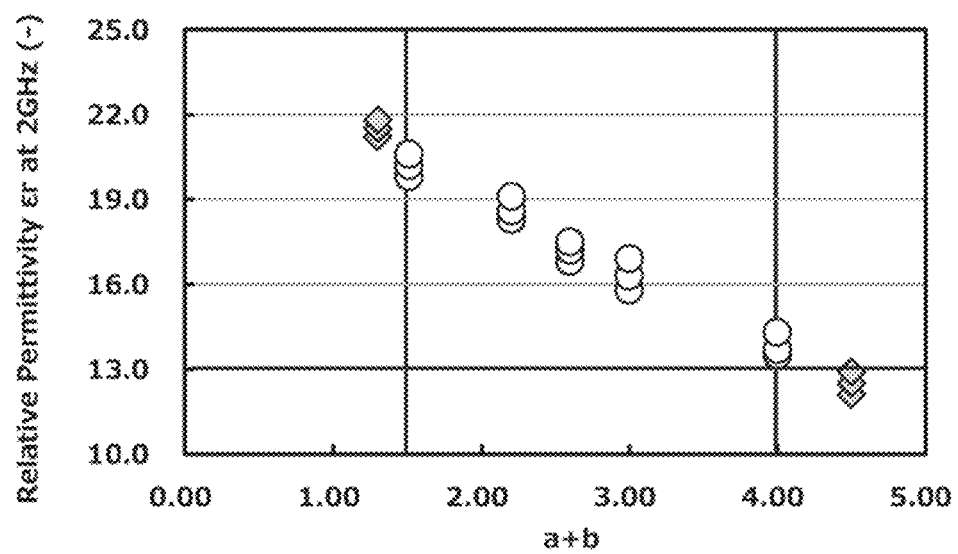
FIG. 2B is a graph showing a relation between "a+b" and a relative permittivity at 2 GHz of examples and comparative examples of the present invention.

According to Table 1, FIG. 2A, and FIG. 2B, when "a+b" was within the above mentioned range in the complex oxide constituting the dielectric film, it was confirmed that the relative permittivity was 13.0 or more and the Q value was 500 or more at 2 GHz.

Example 2

The thin film capacitor was produced by the same method as Sample No. 1 of Example 1 except for forming the dielectric film by a sputtering method, and the same evaluations as Example 1 were carried out. As a target, the same target as the PLD target of Example 1 was used. Results are shown in Table 2.

Example 3

The thin film capacitor was produced by the same method as Sample No. 1 of Example 1 except for changing the thickness of the dielectric film, and the same evaluations as Example 1 were carried out. Results are shown in Table 2.

TABLE 2

| | | (aCaO + bSrO) − ZrO$_2$ | | | Properties | |
|---|---|---|---|---|---|---|
| | | | | | Q | Relative permittivity |
| Sample No. | a | b | a + b | Thickness (nm) | at 2 GHz (—) | at 2 GHz (—) |
| Example 1 | 1 | 1.51 | 0.00 | 1.51 | 400 | 502 | 19.8 |
| Example 2 | 25 | 1.51 | 0.00 | 1.51 | 400 | 514 | 19.7 |
| Example 3 | 26 | 1.51 | 0.00 | 1.51 | 200 | 505 | 19.7 |
| | 27 | 1.51 | 0.00 | 1.51 | 800 | 518 | 19.8 |

According to Table 2, when a sputtering method is used as a known method for forming a film (see Sample No. 25), it was confirmed that the same properties as Example 1 can be obtained. That is, it was confirmed that the properties of the dielectric composition of the present invention does not depend on the method for forming a film.

Also, it was confirmed that the same properties can be obtained even when the thickness of the dielectric film was changed. That is, as long as the thickness was within the above mentioned range, it was confirmed that the properties of the dielectric composition of the present invention did not depend on the thickness.

INDUSTRIAL APPLICABILITY

An electronic component having a dielectric film including a dielectric composition according to the present invention can attain both a high relative permittivity (for example 13.0 or more) and a high Q value (for example 500 or more) even at high frequency bands. Therefore, such electronic component can be suitably used as a high frequency component.

DESCRIPTION OF THE REFERENCE NUMERAL

10 . . . Thin film capacitor
1 . . . Substrate
2 . . . Underlayer
3 . . . Lower electrode
4 . . . Upper electrode
5 . . . Dielectric film

What is claimed is:

1. A dielectric composition including a complex oxide consisting of (i) at least one of CaO and SrO, and (ii) ZrO$_2$ and expressed by a formula (aCaO+bSrO)—ZrO$_2$ as a main component, in which "a" and "b" of the formula satisfy a≥0, b≥0, and 1.55≤a+b≤4.00, wherein a relative permittivity at 2GHz is 13.0 or more.

2. The dielectric composition according to claim 1, wherein "a" and "b" of the formula satisfy 1.55≤a+b≤2.20.

3. The dielectric composition according to claim 1, wherein "a" and "b" of the formula satisfy 3.00≤a+b≤4.00.

4. An electronic component comprising a dielectric film including the dielectric composition according to claim 1.

5. An electronic component comprising a dielectric film including the dielectric composition according to claim 2.

6. An electronic component comprising a dielectric film including the dielectric composition according to claim 3.

* * * * *